(12) United States Patent
Ruchti (10) Patent No.: US 7,607,217 B2
(45) Date of Patent: Oct. 27, 2009

(54) DEVICE FOR PROCESSING A WIRE

(75) Inventor: Nicolas Ruchti, Cham (CH)

(73) Assignee: Komax Holding AG, Dierikon (CH)

( * ) Notice: Subject to any disclaimer, the term of this patent is extended or adjusted under 35 U.S.C. 154(b) by 445 days.

(21) Appl. No.: 10/970,562

(22) Filed: Oct. 21, 2004

(65) Prior Publication Data
US 2005/0087055 A1    Apr. 28, 2005

(30) Foreign Application Priority Data
Oct. 28, 2003    (EP)    ................... 03405773

(51) Int. Cl.
*H01R 43/00*    (2006.01)
*B23Q 23/00*    (2006.01)
*B26D 5/08*    (2006.01)

(52) U.S. Cl. .............................. 29/749; 29/748; 29/751; 29/753; 29/564.4; 29/33 F; 29/33 M; 29/745; 29/755; 29/867; 83/580; 81/9.51; 72/20.1

(58) Field of Classification Search ................... 29/749, 29/748, 740, 760, 564.4, 759, 753, 729, 751, 29/825, 33 F, 33 M, 867, 745; 83/694, 693, 83/689, 685, 580; 219/69.12; 81/9.51, 9.4, 81/3.4; 72/15.1, 20.1, 20.5, 442, 712; 104/105
See application file for complete search history.

(56) References Cited
U.S. PATENT DOCUMENTS

| | | | | |
|---|---|---|---|---|
| 3,972,218 | A * | 8/1976 | Pawloski ..................... | 72/407 |
| 4,642,873 | A * | 2/1987 | Bower et al. ................ | 29/566.3 |
| 4,730,384 | A * | 3/1988 | Frohlich ..................... | 29/564.4 |
| 5,265,502 | A * | 11/1993 | Hoffa ......................... | 81/9.51 |
| 5,711,182 | A * | 1/1998 | Yang ........................ | 72/409.14 |
| 5,842,266 | A * | 12/1998 | Ishiwata ..................... | 29/564.4 |
| 5,934,161 | A * | 8/1999 | Keene ........................ | 81/9.51 |
| 6,170,153 | B1 | 1/2001 | Ichikawa | |
| 6,246,024 | B1 * | 6/2001 | Hosaka ..................... | 219/69.12 |
| 6,289,573 | B1 * | 9/2001 | Imgrut ..................... | 29/564.4 |
| 6,327,775 | B1 * | 12/2001 | Oishi et al. ................... | 29/751 |
| 6,520,061 | B2 * | 2/2003 | Fukuta et al. .............. | 83/651.1 |

FOREIGN PATENT DOCUMENTS

| | | |
|---|---|---|
| DE | 43 25 356 | 9/1994 |
| EP | 0 989 637 | 3/2000 |

* cited by examiner

*Primary Examiner*—Minh Trinh
*Assistant Examiner*—Tai Nguyen
(74) *Attorney, Agent, or Firm*—Fraser Clemens Martin & Miller LLC; William J. Clemens (57) ABSTRACT

A wire processing unit has a crimp head moved in a "z" direction by an eccentric drive and a crimping tool arranged on the crimp head moves with it. The crimp head also moves a pin connected to a lowering unit that has a C-shaped bracket on which the gripper unit is arranged. When a crimping punch moves, the gripper unit is moved with it, and the wire-end held by a gripper pair is inserted into an upwardly-open conductor crimp and an insulation crimp respectively. A cutting head of a cutting unit cuts off the leading wire-end, removes the insulation, and separates contacts with defective crimp fastening from the wire-end.

8 Claims, 14 Drawing Sheets

DEVICE FOR PROCESSING A WIRE

BACKGROUND OF THE INVENTION

The present invention relates to a device for processing a wire, comprising components for holding and cutting the wire.

The European patent specification EP 0 989 637 A1 shows a processing unit for processing wire-ends. The processing unit cuts the leading ends off wires and fastens contacts onto the stripped wire-ends by means of crimping. The processing unit comprises arranged in a machine frame including a gripper unit, a cutting head, an ejector, an adjusting device, and a crimping device. The wire-end of a wire is advanced manually as far as a processing area, with a trigger detecting the correct position of the wire-end. As soon as the trigger detects the wire-end, the processing operation begins, defectively fastened contacts being separated from the wire by means of a contact cutter. The cutting head comprises a separating cutter to cut the leading wire-end off the wire and a stripping cutter to strip the wire-end of insulation.

A disadvantage of this known device is that in the case of a defectively fastened contact, the gripper unit must perform a swiveling movement to the contact cutter. Furthermore, for the processing, a total of three cutters are needed (separating cutter, stripping cutter, and contact cutter).

SUMMARY OF THE INVENTION

The present invention concerns a wire processing device which is mechanically simply constructed and operates reliably. The device includes components for holding and cutting the wire, such as a cutting head with a cutter pair and means for operating the cutter pair to process the wire by cutting off a leading wire-end, removing insulation, and cutting off from the wire-end a crimp contact with defective crimp connections. The means for operating includes a first drive for moving said cutting head in a "y" direction, a second drive for moving said cutting head in an "x" direction, and a third drive for actuating the cutter pair. The device also includes a sensor integrated into the cutting head for wire detection, the sensor being movable with the cutting head and being movable relative to the cutting head.

The device includes a container arranged on the cutting head for collecting remnants of insulation, remnants of wire, and cut-off crimp contacts, the container being movable with the cutting head, and the cutting head being movable relative to the container. One end-face of the container is arranged on the cutting head and another end-face is formed by a sensor housing, the one end-face removing contents from the container during the movement of the cutting head relative to the container.

The advantages achieved by the present invention are essentially that all cutting operations (cutting off, stripping of insulation, cutting contacts) can be performed with only one pair of cutters. The swiveling movement of the gripper unit when cutting contacts is thereby obviated. Overall, the processing can be performed with a simpler mechanism, with less adjustment work, and in a shorter time. Furthermore, the problem of disposing of remnants of insulation and cut-off contacts is solved in a simple manner.

DESCRIPTION OF THE DRAWINGS

The above, as well as other advantages of the present invention, will become readily apparent to those skilled in the art from the following detailed description of a preferred embodiment when considered in the light of the accompanying drawings in which:

FIG. 12 is a perspective view of the cutter drive shown in FIGS. 11, 11a;

FIG. 13 is a perspective view of the sensor drive shown in FIGS. 11, 11a; and

FIG. 14 is a perspective view of the cutter pair shown in FIGS. 11, 11a.

DESCRIPTION OF THE PREFERRED EMBODIMENT

Figure 1:
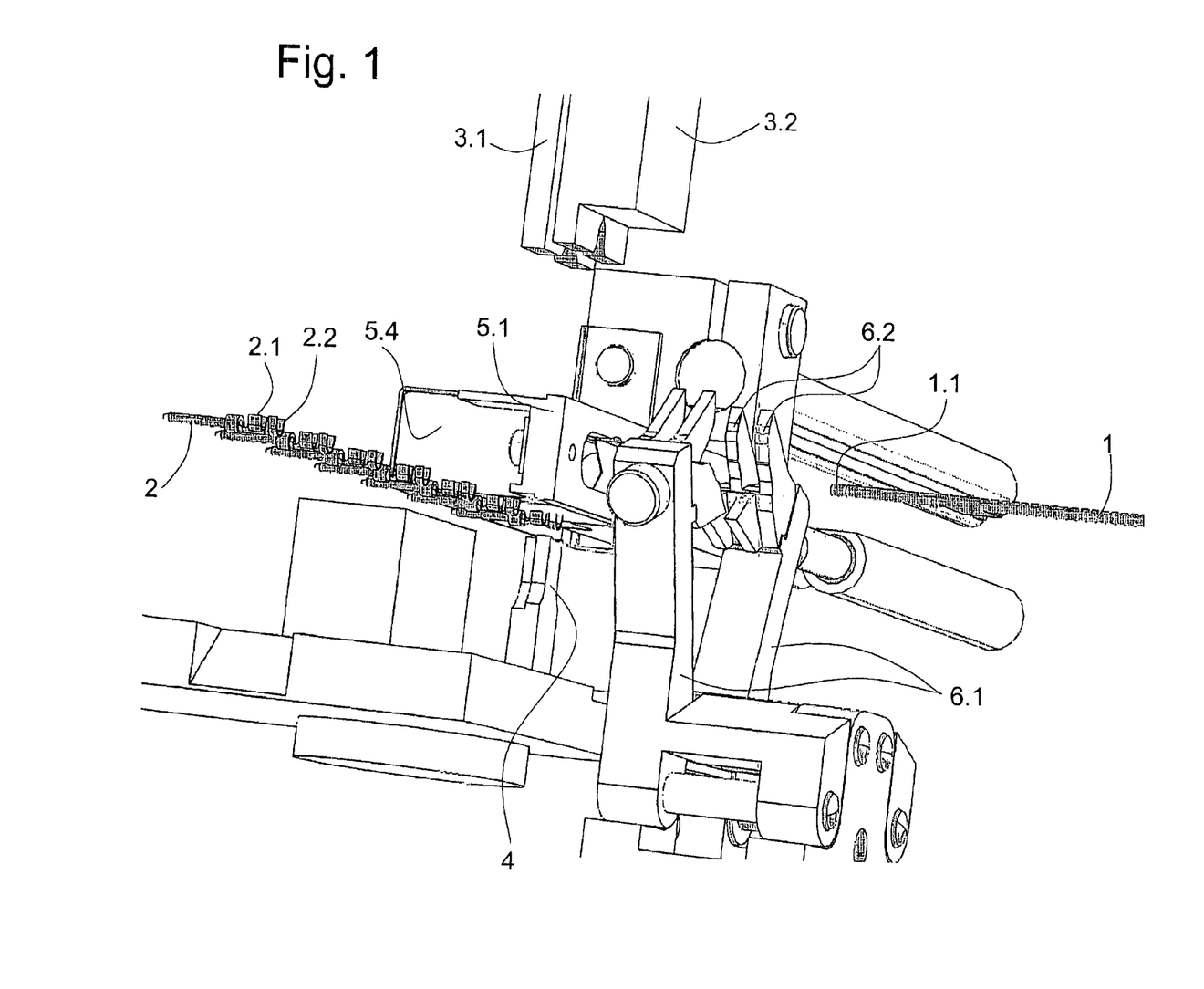
FIG. 1 is a fragmentary perspective view of a wire processing unit in accordance with the present invention.
Figure 10:
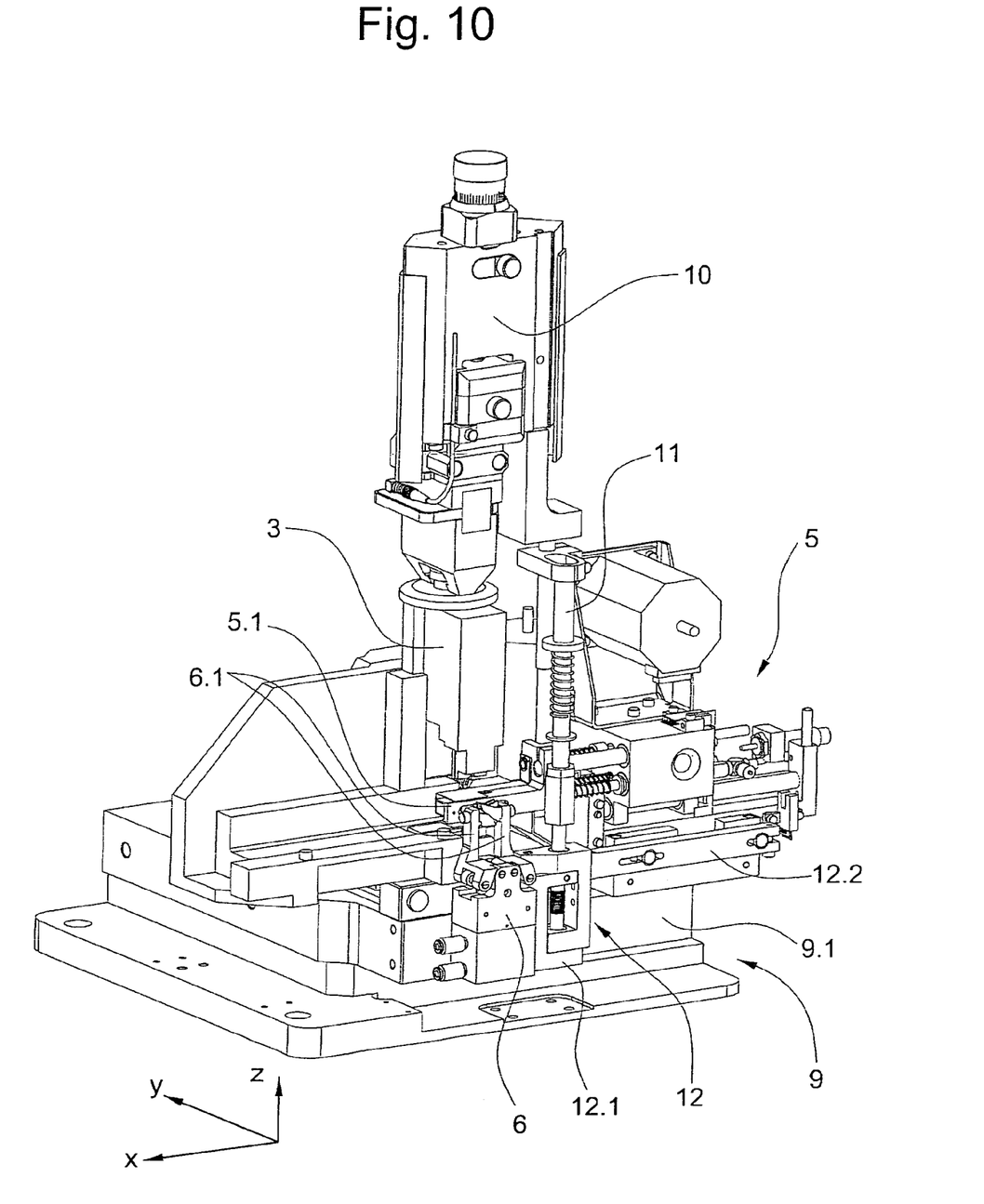
FIG. 10 is a perspective view of the complete processing unit shown in FIG. 1.

FIG. 1 shows the main parts of a unit according to the present invention for processing a wire-end. For creation of a crimped connection between a wire-end 1.1 of a wire 1 and a crimp contact 2, a crimp punch 3.1 for a conductor crimp 2.1 and a crimp punch 3.2 for an insulation crimp 2.2 are needed, the crimp punches 3.1, 3.2 pressing the conductor crimp 2.1 and the insulation crimp 2.2 respectively against an anvil 4 and plastically deforming lugs of the conductor crimp 2.1 and the insulating crimp 2.2 respectively. The wire 1 is advanced as far as a cutting head 5.1 and held by a gripper pair 6.1 by means of mutually interlocking fingers 6.2. The cutting head 5.1 cuts off the leading wire-end 1.1 and strips the wire-end 1.1 of insulation as far as necessary for the conductor crimp 2.1. To create the crimp connection, the crimp punches 3.1, 3.2 are lowered in a vertical direction, the gripper pair 6.1 and the wire-end 1.1 being lowered with them. As shown diagrammatically, the crimp contacts 2 are fed on a belt with the upwardly-open conductor crimp 2.1 and the upwardly-open insulation crimp 2.2 respectively. The complete processing unit is shown in FIG. 10.

Figure 2:
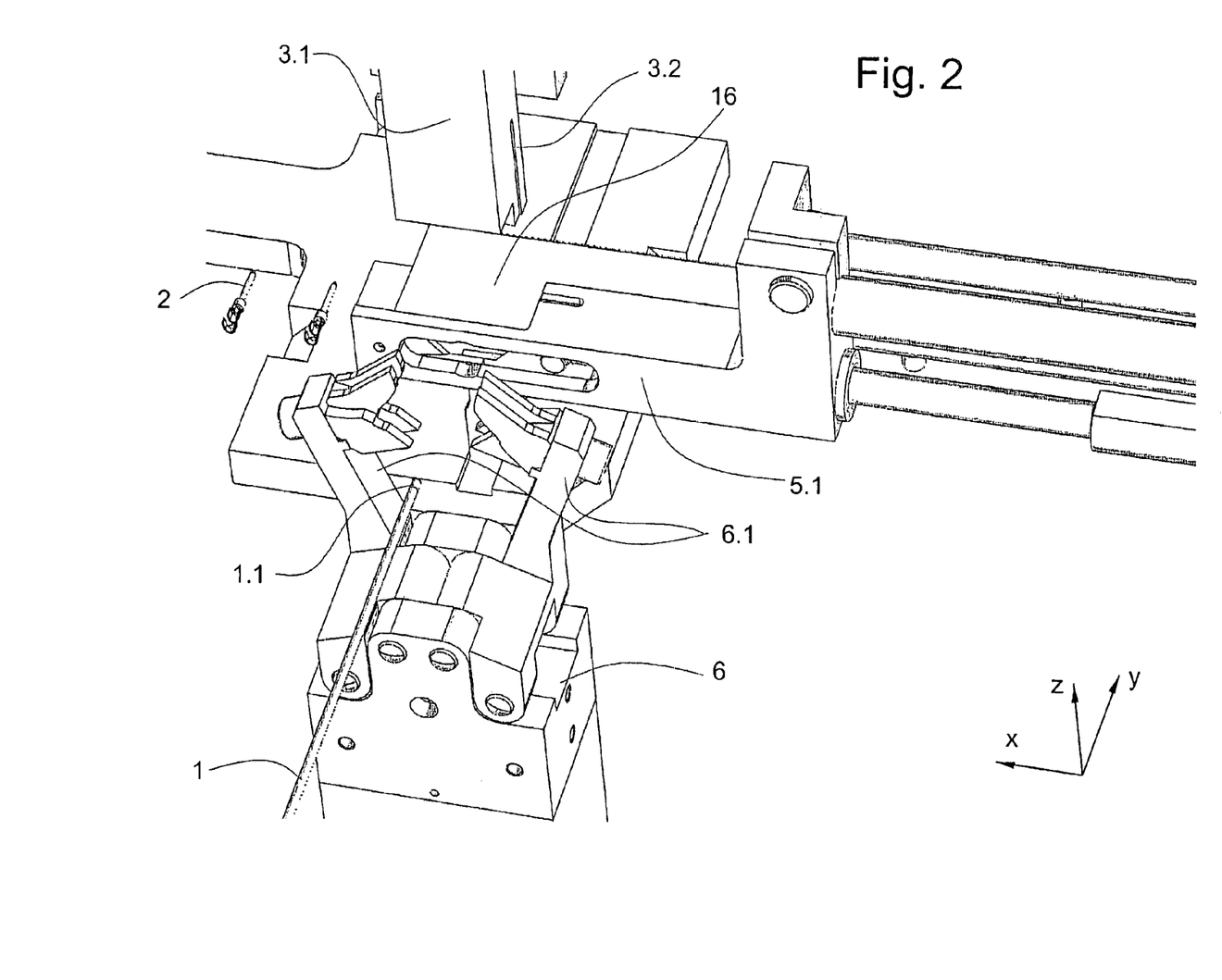
FIGS. 2 to 9 are perspective views of the wire processing unit shown in FIG. 1 processing a wire-end.

FIG. 2 through FIG. 9 show the procedure for processing the wire-end 1.1. FIG. 2 shows the processing unit in the starting position. The cutting head 5.1, which is movable in the "x/y" directions, is situated below the crimp punches 3.1, 3.2 which are movable in the "z" direction, and the gripper pair 6.1 of a gripper unit 6 which is movable in the "z" direction is open. The wire 1 with the wire-end 1.1 is ready for advancing as far as, and into, the cutting head 5.1.

Figure 3:
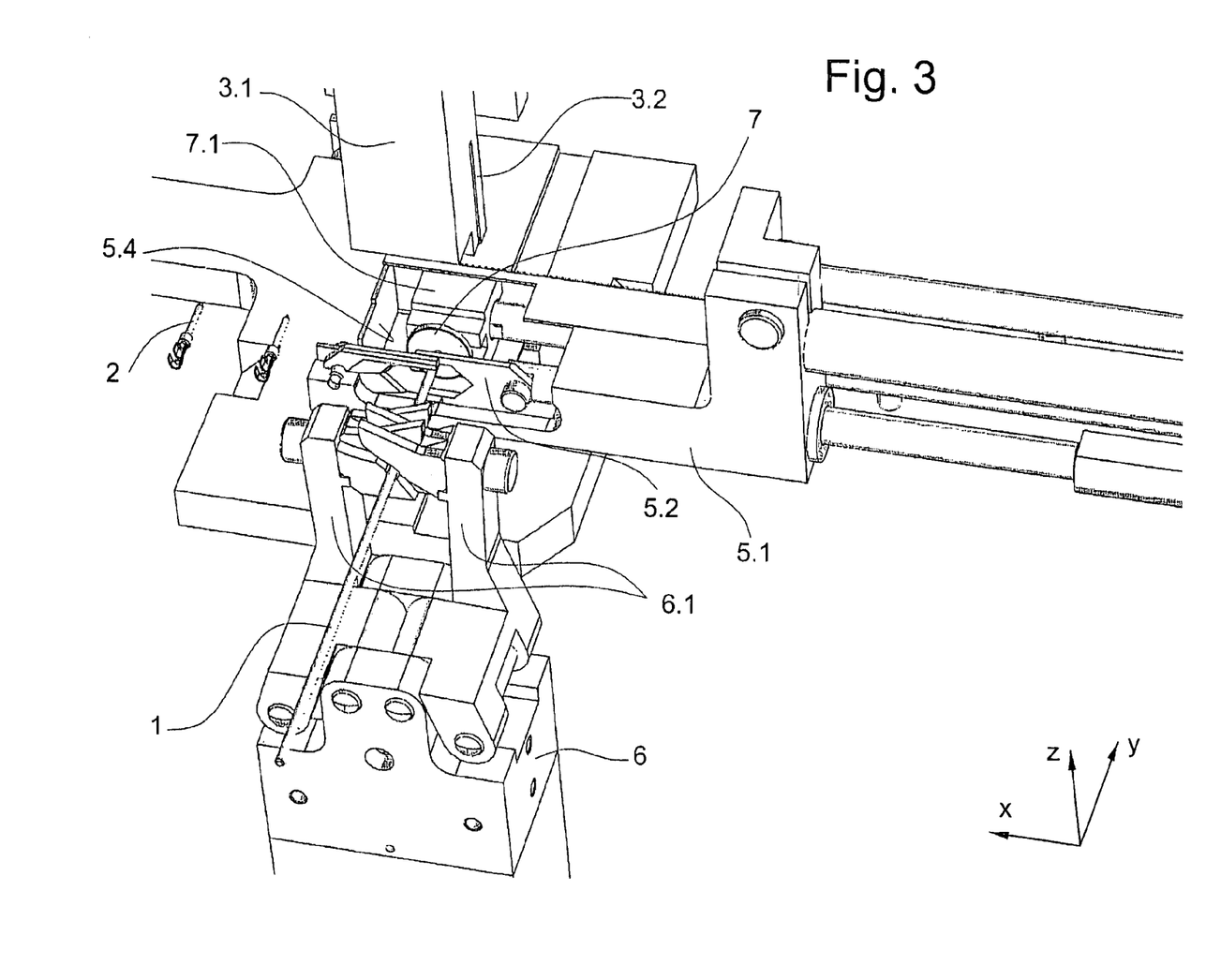
Figure 4:
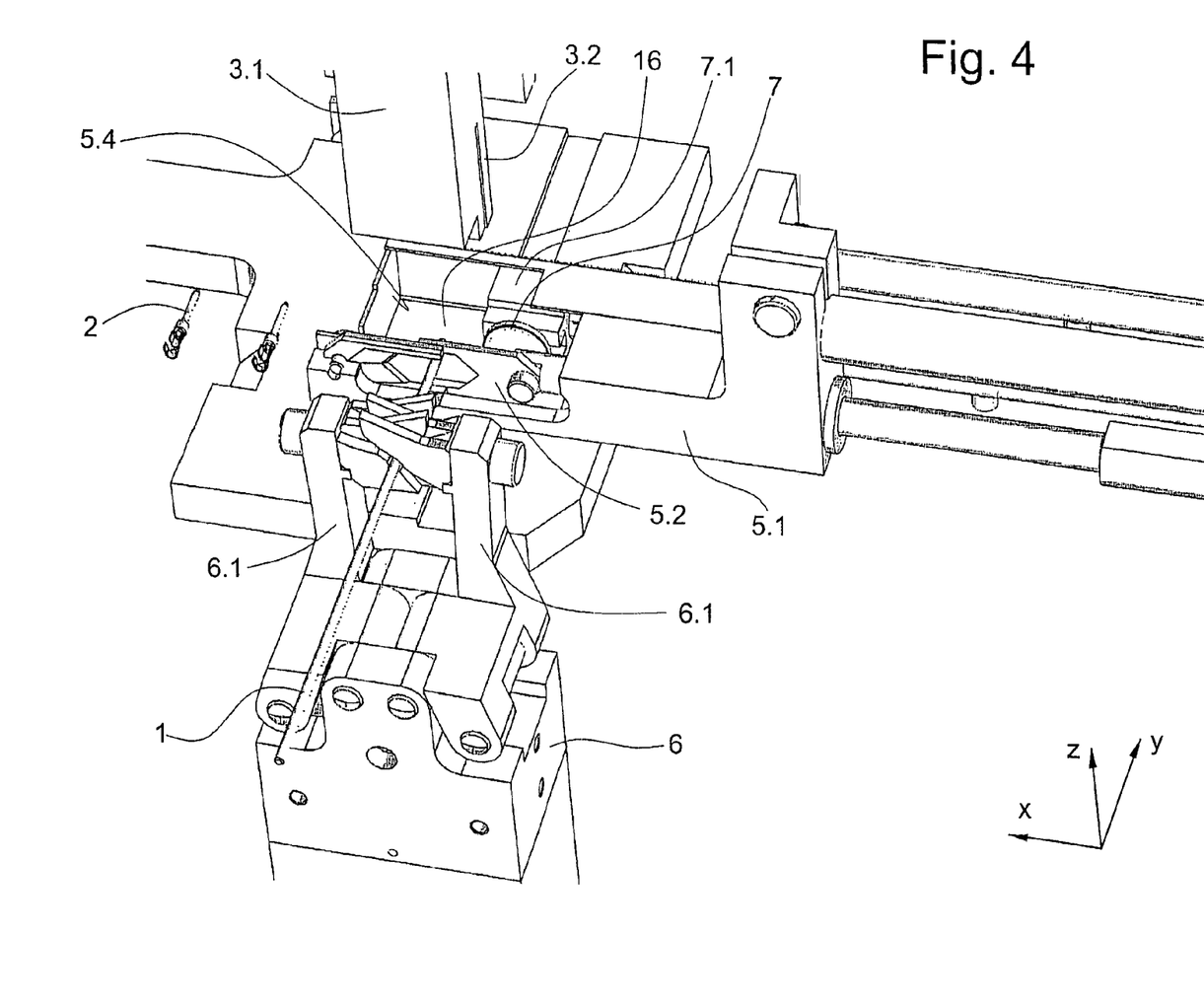

In FIG. 3 the cutting head 5.1 has been opened at the top to show the details. The wire-end 1.1 has been advanced as far as a sensor 7 and the gripper pair 6.1 has been closed. A cutter pair 5.2 of the cutting head 5.1 is open. As soon as the sensor 7 detects the wire-end 1.1, the gripper pair 6.1 is closed and the wire 1 held firmly. Following this, the sensor 7 is moved in the "x" direction out of proximity to the wire as shown in FIG. 4.

Figure 5:
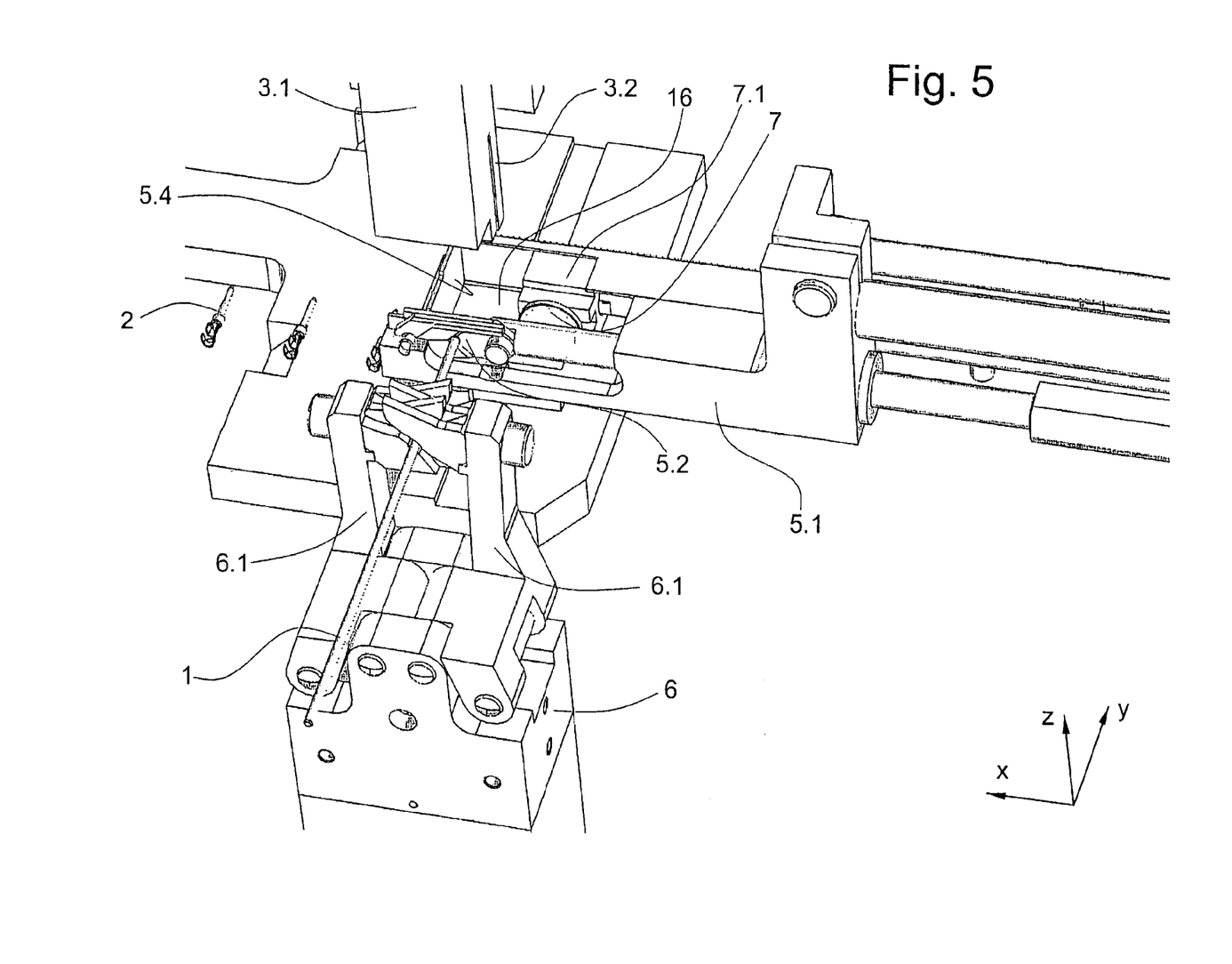
Figure 6:
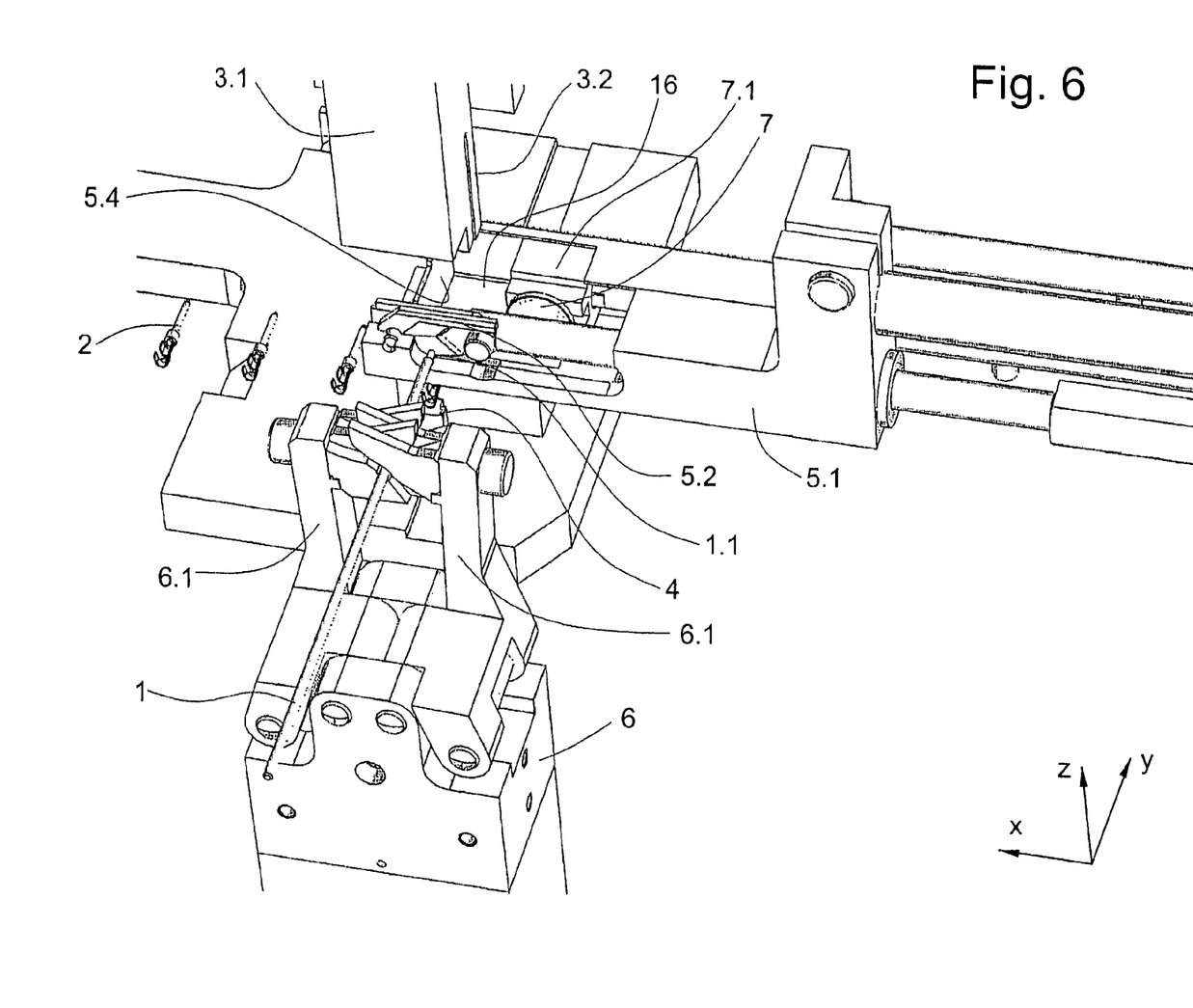

The stripping operation is performed as shown in FIG. 5 by closing the cutter pair 5.2 and cutting into the wire insulation and, as shown in FIG. 6, by a movement of the cutting head 5.1 in the "y" direction away from the gripper unit 6 until the desired length stripped of insulation is obtained. The cutter pair 5.2 is then completely closed and the wire-end cut through, the remnant of insulation being collected with the cut-off wire strands in a container of the cutting head 5.1.

The leading wire-end 1.1 can also be first cut off to the correct length and the insulation then cut into and pulled off.

Figure 7:
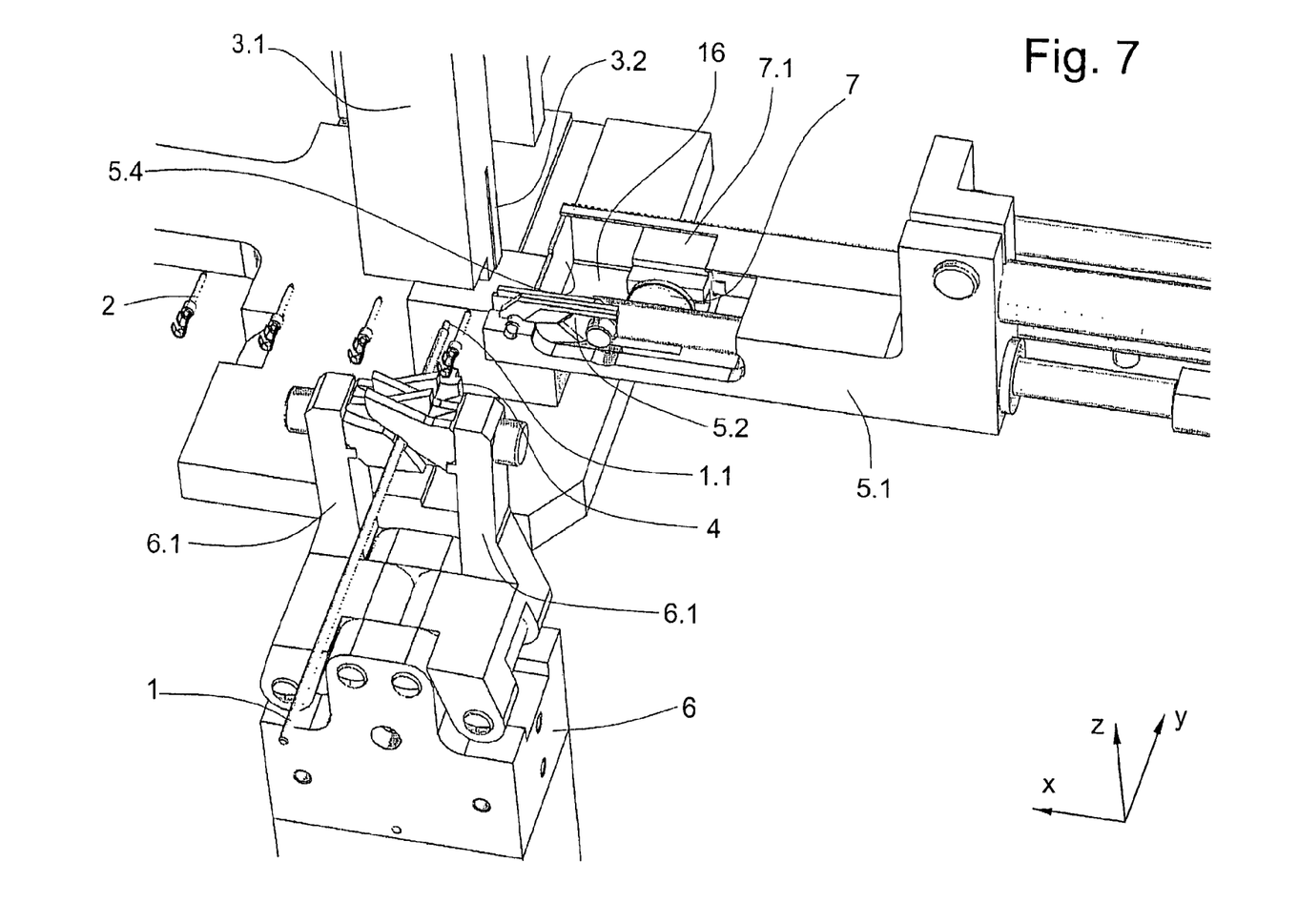
Figure 8:
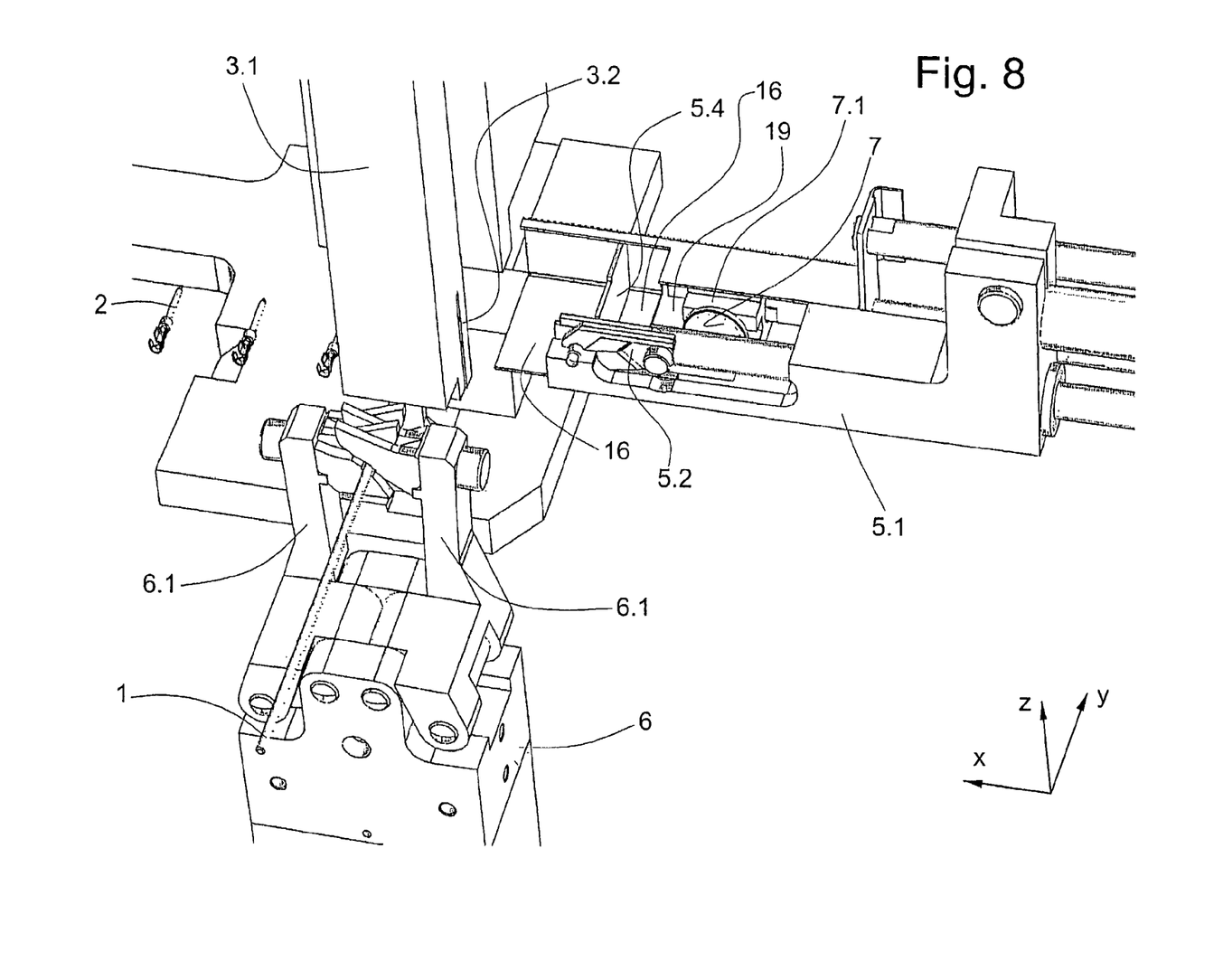
Figure 9:
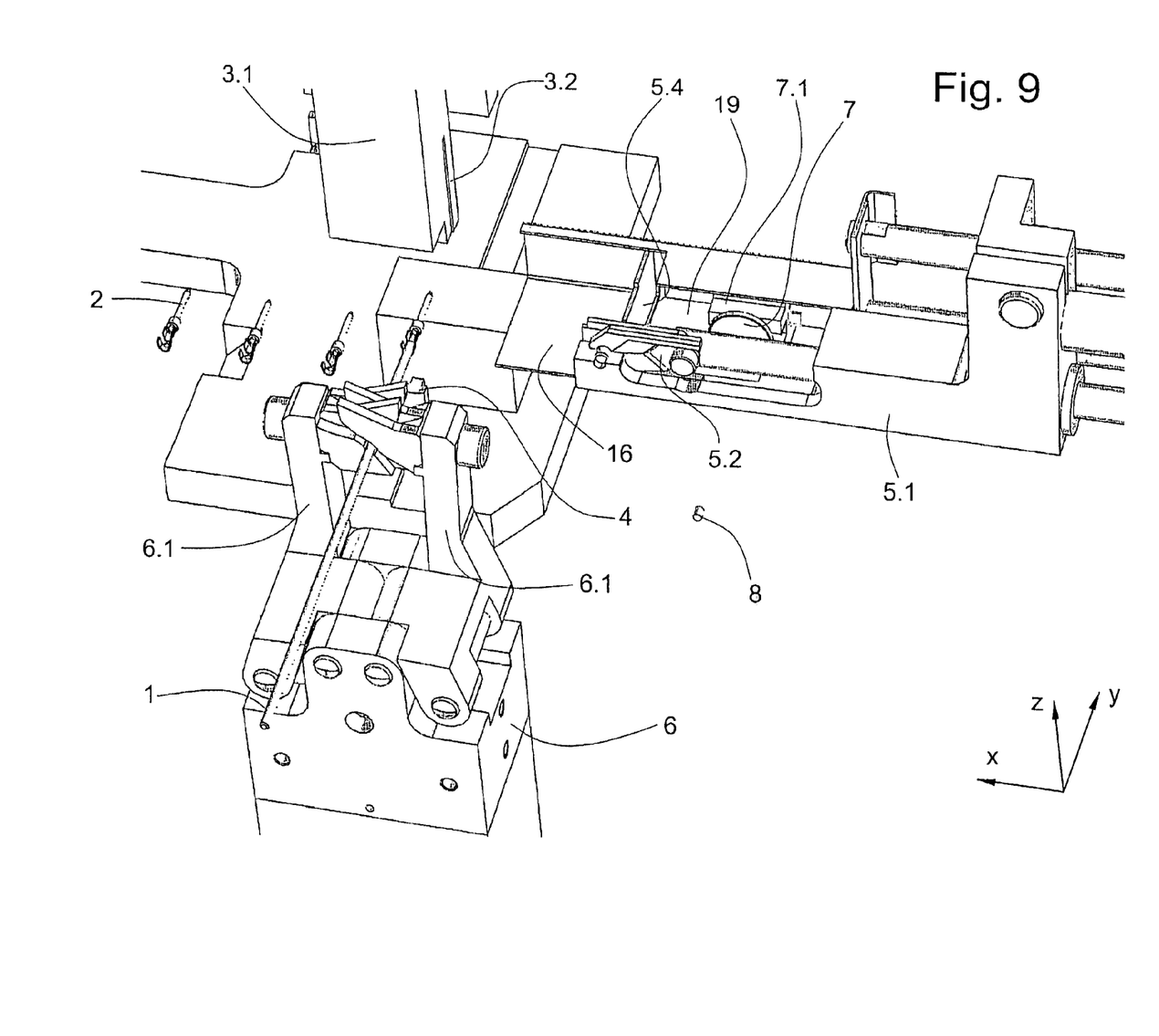

As shown in FIG. 7, after the insulation-stripping operation the cutting head 5.1 is moved out of the vicinity of the crimping punch 3.1, 3.2 in the "y" direction. FIG. 8 shows the movement of the crimping punch 3.1, 3.2 in the "z" direction to perform the crimp-fastening between the wire-end 1.1 and the crimp-contact 2. FIG. 9 shows the completely processed wire-end 1.1. At the end of the cutting-head return-travel, a remnant of insulation 8 is removed from the container. If, for example, the crimp fastening is recognized as bad by a device for evaluating the pattern of crimping force, the cutting head 5.1 is again moved in the "x" direction and in the "y" direction, after which the cutter pair 5.2 separates the crimp contact 2 from the wire-end 1.1. At the end of the cutting-head return-travel the separated crimp contact is removed from the container.

FIG. 10 shows a complete processing unit 9 according to the present invention. A crimping head 10 is moved by, for example, an eccentric drive (not shown) in the "z" direction, a crimping tool 3 arranged on the crimping head 10 being moved together with the crimping punch 3.1, 3.2. The crimping head 10 also moves a pin 11 which is connected to a lowering unit 12 arranged on a cutting unit 5 by means of arms 12.2. The lowering unit 12 has a C-shaped bracket 12.1 on which the gripping unit 6 is arranged. When the crimping punch 3.1, 3.2 is moved, the gripping unit 6 is moved together with it, the wire-end 1.1 held firmly by the gripping pair 6.1 being laid into the upwardly-open conductor crimp 2.1 and the insulating crimp 2.2 respectively. The cutting head 5.1 of the cutting unit 5 cuts off the leading wire-end 1.1, removes the insulation, and separates contacts with defective crimp fastening from the wire-end 1.1. Details are shown in the subsequent drawings.

Figure 11:
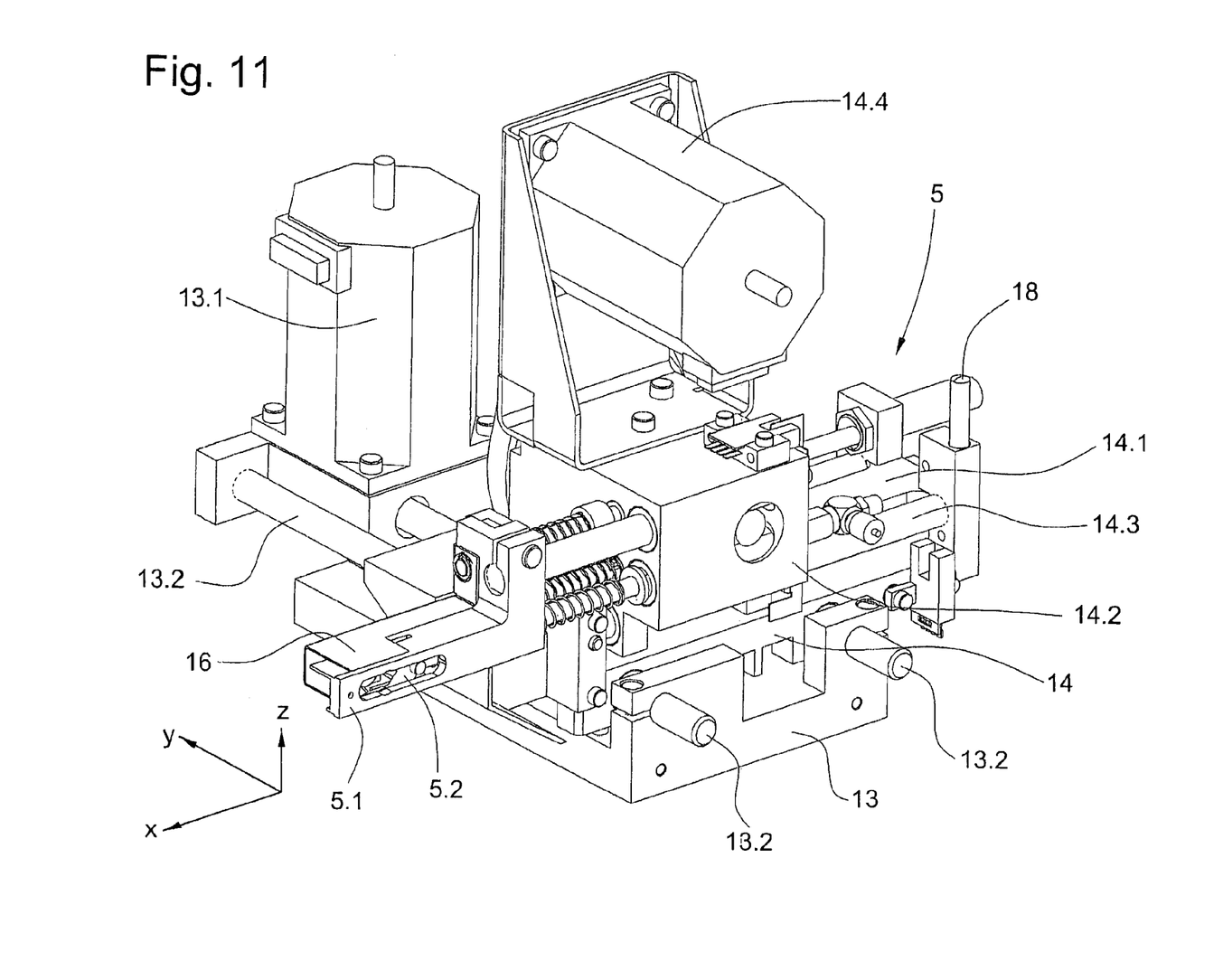
FIGS. 11, 11a are enlarged perspective views of the cutter unit shown in FIG. 10.

FIG. 11 shows the cutting unit 5 comprising a first housing 13 arranged on a base 9.1 of the processing unit 9, there being arranged on the first housing 13 a first drive 13.1 for moving the cutting head 5.1 in the 'y' direction. A second housing 14 is held slidably on guide rods 13.2 of the first housing 13, the first drive 13.1 moving the second housing 14 in the "y" direction. The ends of the rods also serve to fasten the arms 12.2 of the lowering unit 12. Arranged on the second housing 14 is a second drive 14.1 which moves a slide-block 14.2 in the "x" direction along guides 14.3 arranged on each side of the second drive 14.1.

Figure 11A:
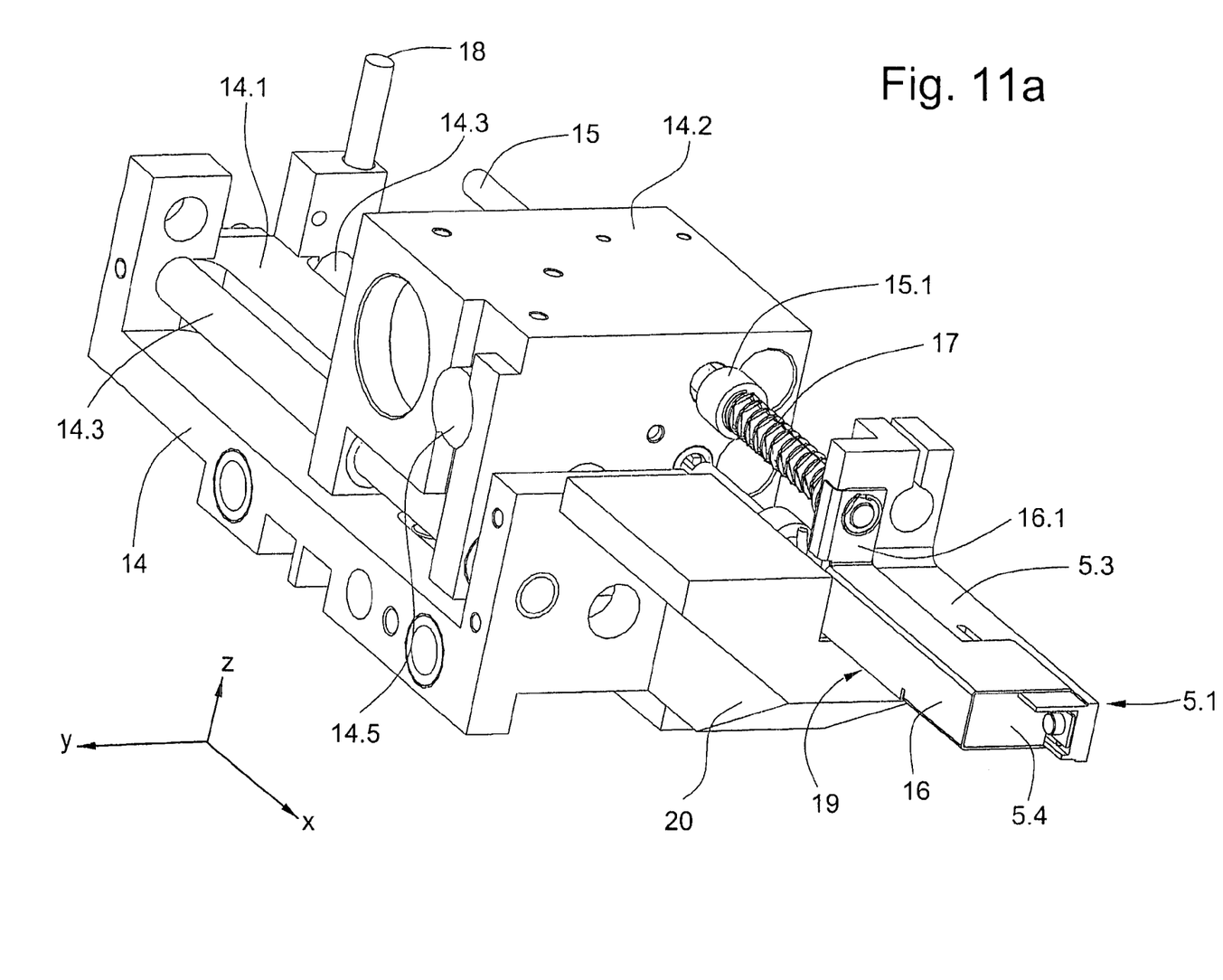

FIG. 11a shows the second housing 14 with the slide-block 14.2 on which a fourth drive 14.5 for moving the sensor 7 integrated in the cutting head 5.1 is arranged. Held in bearings on the slide-block 14.2 is also a rod 15 which is connected to a container 16 which collects remnants of insulation, remnants of wire, and cut-off crimp contacts. A compression spring 17 presses the rod 15 onto a flange 15.1 against a cutting-head housing 5.3, a vane 16.1 of the container 16 resting firmly against the cutting-head housing 5.3. During the return movement in the "x" direction of the cutting head 5.1, the container moves with it until the rod 15 rests against a stop 18 of the second housing 14. The container 16 then remains stationary relative to the cutting head 5.1, an end-face 5.4 arranged on the cutting-head housing 5.3 pushing the contents of the container 16 over a floor-opening 19 into a collector 20. The end-face lying opposite is formed by a housing 7.1 of the sensor 7 integrated into the cutting head 5.1.

Figure 12:
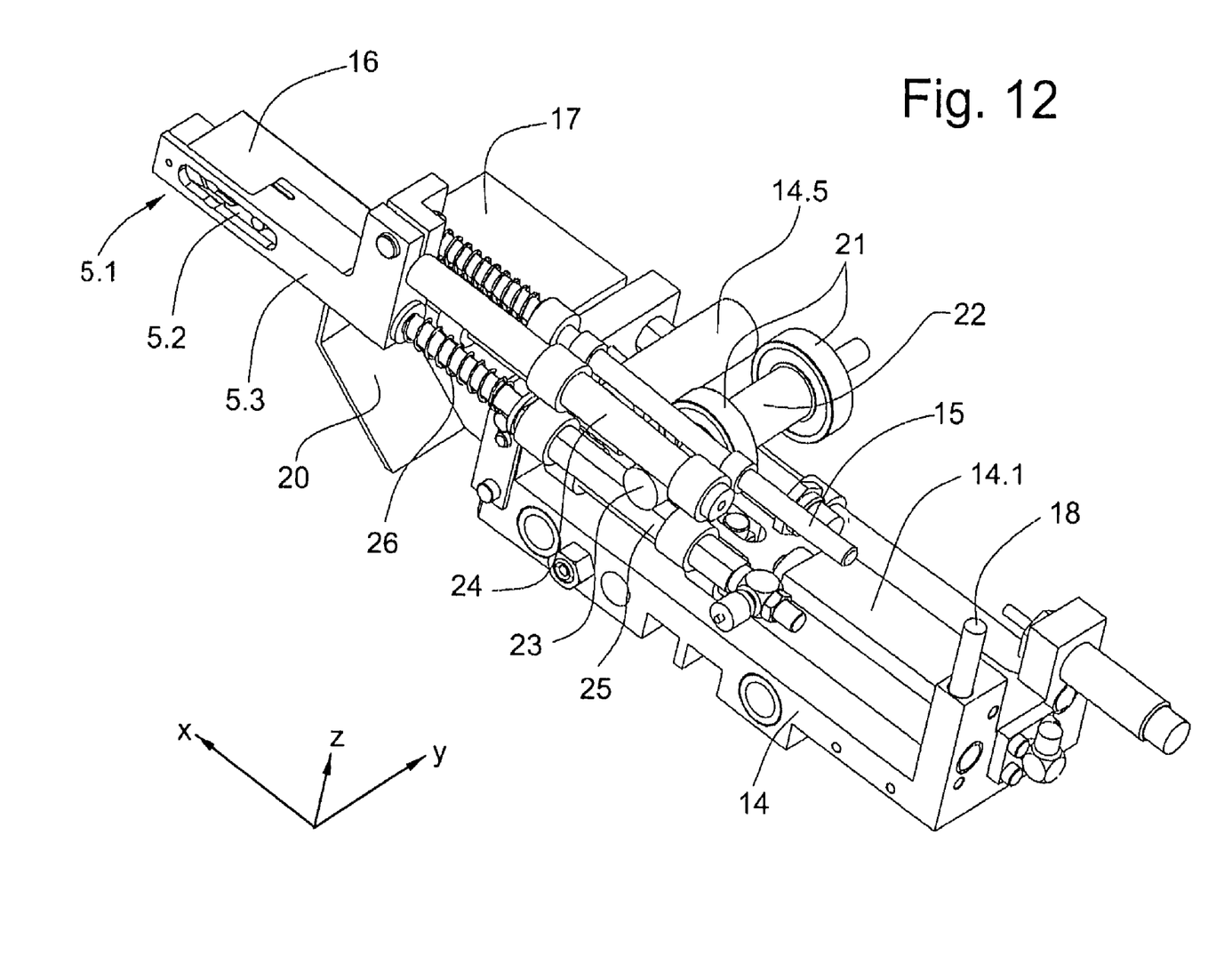

FIG. 12 shows details of the drive of the cutter pair 5.2. A third drive 14.4 drives a pinion shaft 22 which is held in bearings 21 of the slide-block 14.2 and on one end of which a pinion 23 is held in bearings. The pinion 23 in turn drives a first toothed rack 24 and, in the opposite direction to it, a second toothed rack 25. The first toothed rack 24 is held in bearings on the slide-block 14.2 and connected at one end to the cutting-head housing 5.3 on which a cutter 5.5 of the cutter pair 5.2 is also arranged. The second toothed rack 25 is held by bearings on the slide-block 14.2 and connected at one end to the opposite cutter of the cutter pair 5.2. A spring 26 compensates play on the pinion 23.

Figure 13:
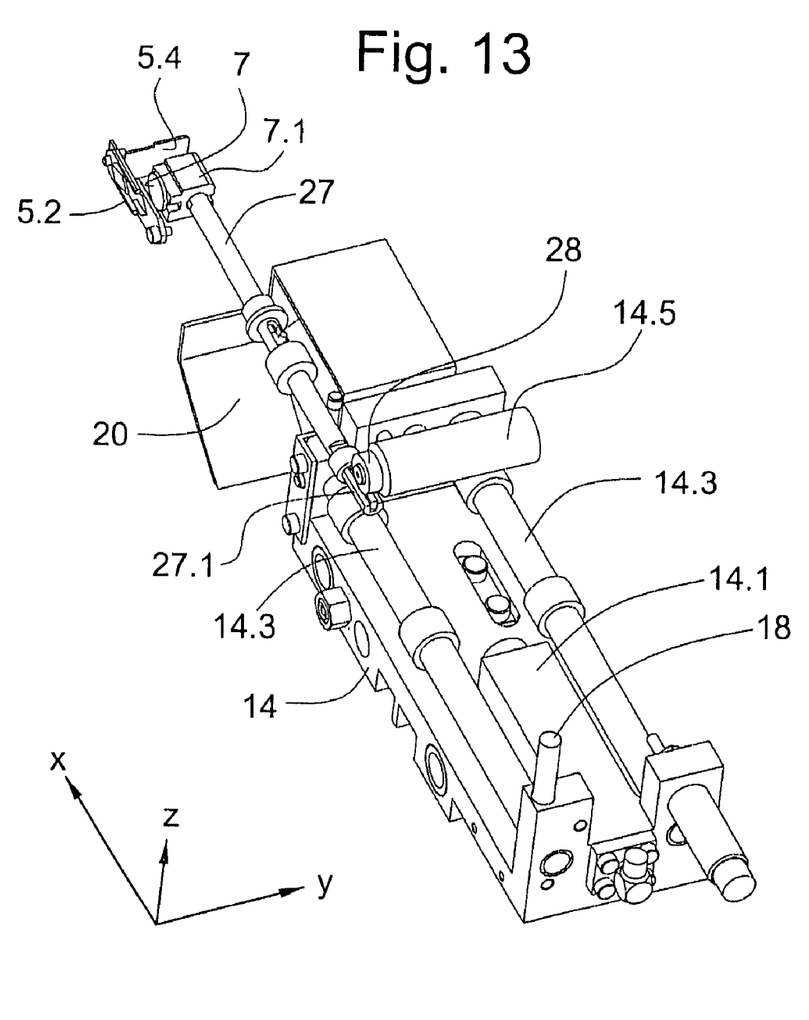

FIG. 13 shows details of the sensor drive, the fourth drive 14.5 driving by means of a pinion 28 a bar 27 with a toothed rack 27.1. The bar 27 is held in bearings on the slide-block 14.2 and carries the sensor 7 with sensor housing 7.1 which also at least partially forms the end-face of the container 16 opposite the end-face 5.4. With the sensor 7 pulled back, the floor-opening 19 is uncovered.

Figure 14:
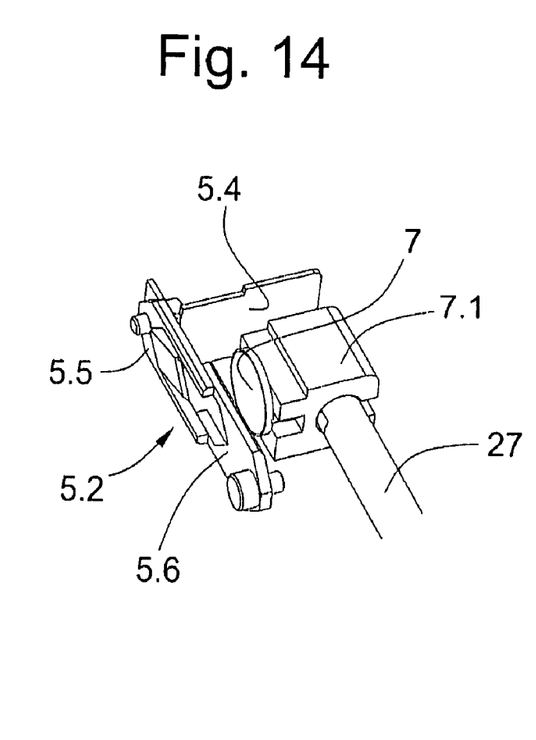

FIG. 14 shows details of the cutter pair 5.2 shown open with the sensor 7 positioned behind the cutter pair 5.2. The cutter 5.5 is arranged on the cutting-head 5.3, an opposing cutter 5.6 is connected directly to the second toothed rack 25, the cutter 5.5 and the opposing cutter 5.6 being moved in opposite directions.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A device for processing a wire including components for holding and cutting the wire, comprising:
    a first housing;
    a second housing mounted on said first housing for movement in a "y" direction relative to said first housing;
    a first drive mounted on said first housing for moving said second housing in the "y" direction;
    a slide block mounted on said second housing for moving in an "x" direction relative to said first housing and said second housing;
    a second drive mounted on said second housing for moving said slide block in the "x" direction;
    a cutting head with only a single cutter pair mounted on said slide block; and
    a third drive mounted on said slide block for actuating said single cutter pair to process the wire by cutting off a leading wire-end, removing insulation, and cutting off from the wire-end a crimp contact with defective crimp connections.

2. The device according to claim 1 including a sensor integrated into said cutting head for wire detection, said sensor being movable with said cutting head and being movable relative to said cutting head.

3. The device according to claim 1 including a container arranged on said cutting head for collecting remnants of insulation, remnants of wire, and cut-off crimp contacts, said container being movable with said cuffing head, and said cutting head being movable relative to said container.

4. The device according to claim 3 wherein one end-face of said container is arranged on said cutting head and another end-face is formed by a sensor housing, said one end-face removing contents from said container during a movement of said cutting head relative to said container.

5. The device according to claim 3 wherein said container has one end-face arranged on said cuffing head for removing contents from said container during a movement of said cuffing head relative to said container.

6. A device for processing a wire including components for holding and cutting the wire, comprising:
    a cutting head with only a single cutter pair for processing the wire;

a first drive for moving said cutting head in a "y" direction;

a second drive for moving said cutting head in an "x" direction;

a third drive for actuating said cutter pair whereby said first drive, said second drive, said third drive and said cutter pair cooperate for cutting off a leading wire-end, removing, insulation, and cutting off from the wire-end a crimp contact with detective crimp connections; and a container arranged on said cutting head for collecting remnants of insulation, remnants of wire, and cut-off crimp contacts, said container being movable with said cutting head, and said cutting head being movable relative to said container.

7. The device according to claim 6 including a sensor integrated into said cutting head for wire detection, said sensor being movable with said cuffing head and being movable relative to said cutting head.

8. The device according to claim 6 wherein one end-face of said container is arranged on said cutting head and another end-face is formed by a sensor housing, said one end-face removing contents from said container during a movement of said cuffing head relative to said container.

* * * * *